US007005243B2

(12) United States Patent
Chen

(10) Patent No.: US 7,005,243 B2
(45) Date of Patent: Feb. 28, 2006

(54) METHOD FOR PRODUCING A LIGHT GUIDE PLATE MOLD HAVING V-SHAPED GROOVES

(75) Inventor: Ga-Lane Chen, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 65 days.

(21) Appl. No.: 10/848,029

(22) Filed: May 17, 2004

(65) Prior Publication Data

US 2004/0229171 A1 Nov. 18, 2004

(30) Foreign Application Priority Data

May 16, 2003 (TW) ................................. 92113405

(51) Int. Cl.
*G03F 7/00* (2006.01)

(52) U.S. Cl. ........................ 430/320; 430/321; 264/2.5

(58) Field of Classification Search ..................... None
See application file for complete search history.

(56) References Cited

U.S. PATENT DOCUMENTS 6,432,328 B1 * 8/2002 Hamanaka et al. ........ 264/1.36
2003/0020189 A1 * 1/2003 Chen et al. ................ 264/1.24
2003/0086030 A1 * 5/2003 Taniguchi et al. ............ 349/61

FOREIGN PATENT DOCUMENTS

JP 7-153122 A * 6/1995

* cited by examiner

*Primary Examiner*—John A. McPherson
(74) *Attorney, Agent, or Firm*—Wei Te Chung

(57) ABSTRACT

A method for producing a light guide plate mold (2) with V-shaped grooves (27) includes the steps of: providing a mold substrate (20); applying a first photoresist (22) onto a main surface (21) of the substrate; forming a first pattern on the first photoresist by photolithography with a first patterned mask (24); etching regions of the main surface not covered by the first photoresist, and removing the first photoresist thereby providing the substrate having substantially U-shaped grooves (26) thereon; applying a second photoresist (32) onto the modified main surface; forming a second pattern on the second photoresist by photolithography with a second patterned mask (34), the second patterned mask having smaller transmissive regions (342) compared to those (242) of the first patterned mask; etching regions of the modified main surface not covered by the second photoresist, and removing the second photoresist, thereby providing the substrate having the V-shaped grooves thereon.

19 Claims, 4 Drawing Sheets

METHOD FOR PRODUCING A LIGHT GUIDE PLATE MOLD HAVING V-SHAPED GROOVES

BACKGROUND OF THE INVENTION

1. Field of the Invention

The present invention relates to a method for producing a light guide plate mold having V-shaped grooves by photolithography, the mold being used for forming light guide plates installed into LCD (liquid crystal display) devices.

2. Description of the Prior Art

Nowadays, backlight units (BLUs) are generally used as light sources of thin film transistor liquid crystal display (TFT-LCD) modules. The function of the BLU is to emit light beams into a display panel of the TFT-LCD module, so as to make the intensity of transmitted light beams as high and as uniform as possible. In order to help achieve this goal, a light guide plate is employed in the BLU. The light guide plate is an important component in the BLU, and is usually made of polymethyl methacrylate (PMMA).

Currently, injection molding is a typical method for mass producing light guide plates. A light guide plate mold is needed for injection molding. The light guide plate mold enables each formed light guide plate to have a micro-optical pattern, such as V-shaped grooves. The micro-optical pattern enables the light guide plate to transmit light beams with high uniformity and brightness.

The light guide plate mold has a predetermined micro-optical pattern therein. In the process of fabrication of the light guide plate, the micro-optical pattern is transferred onto a surface of the light guide plate.

Conventionally, the micro-optical pattern of the light guide plate mold is fabricated by precision machining technology. Micro-scale diamond cutting tools directly score a plurality of V-shaped grooves on a surface of a light guide plate mold substrate. Even though this manufacturing method is simple, it has two notable disadvantages. First, the machine used in the process is very expensive, making the cost of producing the light guide plate mold unduly high. Second, line defects or point defects in the micro-optical pattern are common, thereby reducing the precision of the V-shaped grooves.

Therefore, it is desired to provide a new method for producing a light guide plate mold with V-shaped grooves which overcomes the above-described disadvantages of conventional processes.

SUMMARY OF THE INVENTION

An object of the present invention is to provide a method for producing a light guide plate mold at relatively low cost.

Another object of the present invention is to provide a method for producing a light guide plate mold with a highly precise V-shaped groove pattern.

In order to achieve the above-described objects, a method for producing a light guide plate mold in accordance with the present invention includes the steps of: providing a light guide plate mold substrate; applying a first photoresist onto a main surface of the substrate; forming a first pattern on the first photoresist by photolithography with a first patterned mask; etching regions of the main surface that are not covered by the first photoresist, removing the first photoresist, thereby providing the substrate having substantially U-shaped grooves thereon; applying a second photoresist onto the modified main surface; forming a second pattern on the second photoresist by photolithography with a second patterned mask, the second patterned mask having smaller transmissive regions compared to those of the first patterned mask; etching regions of the modified main surface that are not covered by the second photoresist, and removing the second photoresist, thereby providing the substrate having V-shaped grooves thereon.

Other objects, advantages, and novel features of the present invention will become more apparent from the following detailed description when taken in conjunction with the accompanying drawings.

DETAILED DESCRIPTION OF THE PRESENT INVENTION

Reference now will be made to the drawings to describe the present invention in detail.

Figure 1:
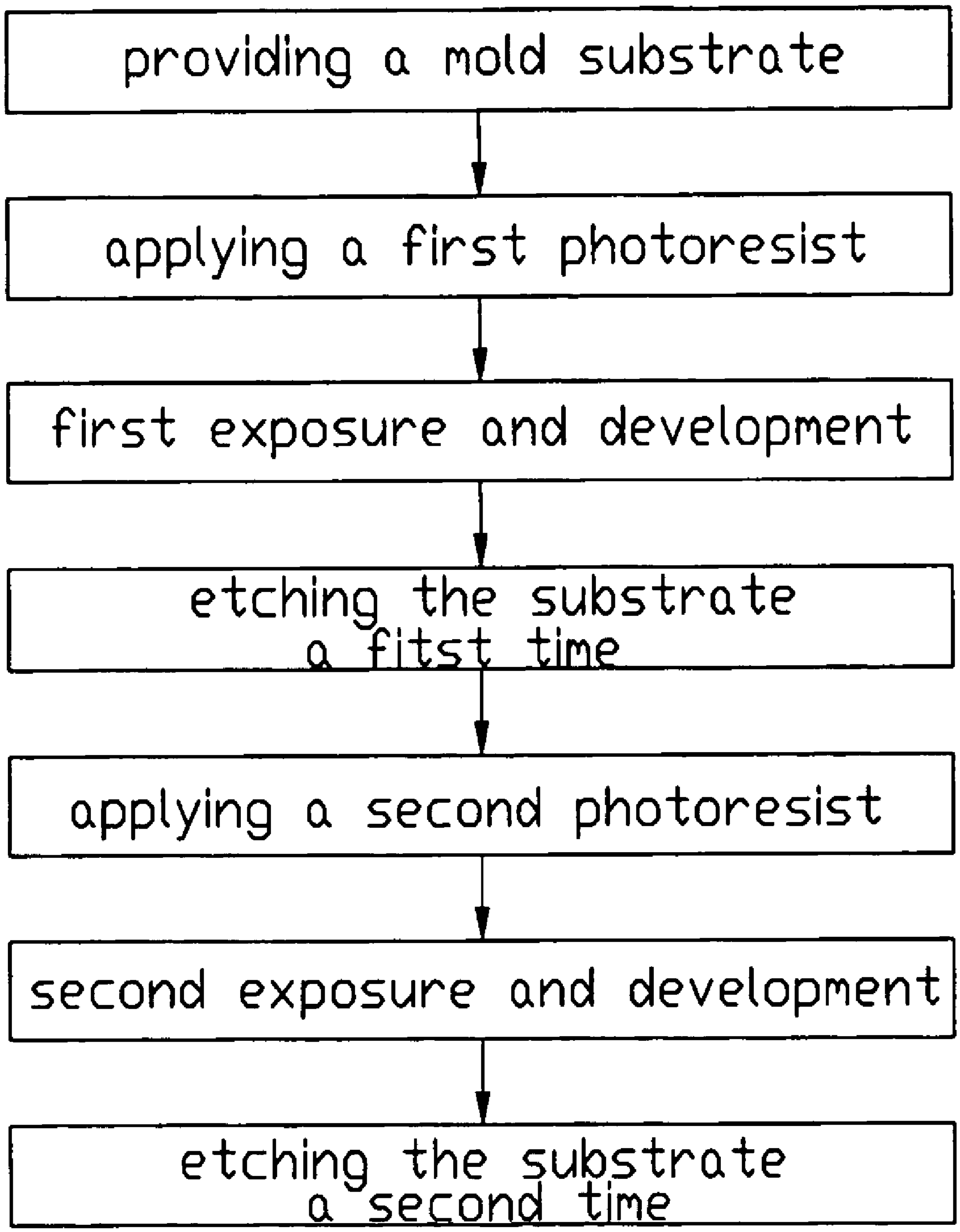
FIG. 1 is a flow chart of a method for producing a light guide plate mold having V-shaped grooves according to the present invention.

Referring to FIG. 1, a flow chart of a method for producing a light guide plate mold having V-shaped grooves according to the present invention is shown. The steps involved in the production process are: providing a mold substrate; applying a photoresist to a main surface of the substrate; first exposure and development; etching the substrate a first time; applying a second photoresist; second exposure and development; and etching the substrate a second time.

The method described in FIG. 1 includes two photolithography processes, each of which is a process of transferring patterns of a mask onto the substrate.

Figure 2:
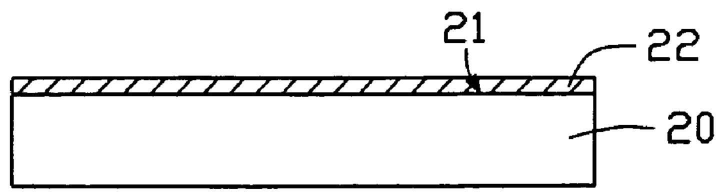
FIGS. 2–11 are schematic, sectional views of sequential stages in producing the light guide plate mold having V-shaped grooves in accordance with the present invention.

Referring also to FIG. 2, in the initial step, a light guide plate mold substrate 20 made of metal or resin is provided. The substrate 20 is chemically cleaned, to remove particulate matter on a main surface 21 thereof and to remove any traces of organic, ionic and metallic impurities.

A pre-measured amount of positive photoresist 22 is then evenly applied to the surface 21 by a spin coater (not shown). A speed of the spin coater is 4000 rpm (revolutions per minute) and a spinning time is 25 seconds, so as to uniformly apply the photoresist 22 onto the main surface 21 to a thickness of about 20 $\mu$m.

Figure 3:
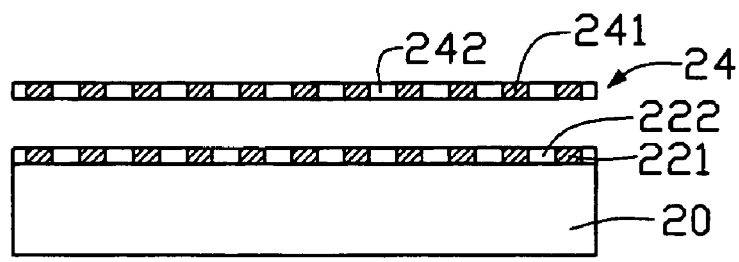

Referring to FIG. 3, a patterned mask 24 is aligned with the substrate 20 opposite to the main surface 21. The mask 24 has a strip pattern, in which transmissive regions 242 and opacity regions 241 are alternately disposed. The photoresist 22 is then exposed to high intensity yellow light through the mask 24. Alternatively, the photoresist 22 may be exposed to UV (ultraviolet) light or another suitable light. The photoresist 22 forms dissolvent regions 222 and retains non-dissolvent regions 221, corresponding to the transmissive regions 242 and the opacity regions 241 respectively.

Figure 4:
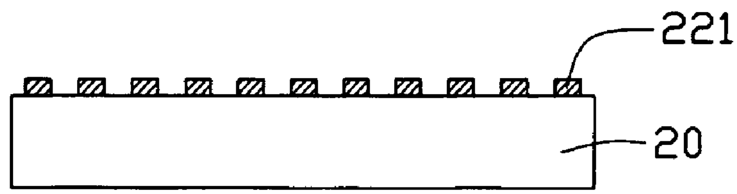

Referring to FIG. 4, the next step in the photolithographic process is development. A developer (not shown) with a predetermined concentration is selected. The substrate 20 is dipped into the developer for a predetermined period of time so as to precisely dissolve and remove the dissolvent regions 222. The non-dissolvent regions 221 remain intact. In this way, the pattern of the mask 24 is transferred to the substrate 20.

Figure 5:
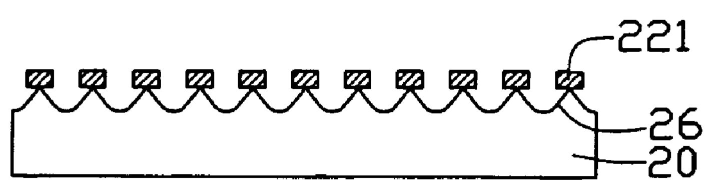

In other words, the photolithography creates a photoresist pattern on the substrate 20. This pattern can then be transferred into the substrate 20 by etching away regions of the substrate 20 that are not covered by the photoresist 22. Referring to FIG. 5, the substrate 20 is dipped in a liquid bath (not shown), usually an acid bath, which contains etchant chemicals for etching the main surface 21 of the substrate 20 with high efficiency. A plurality of U-shaped grooves 26 is thus formed on the substrate 20. Each U-shaped groove 26 has an opening wider than a distance between two corresponding adjacent non-dissolvent regions 221.

Figure 6:
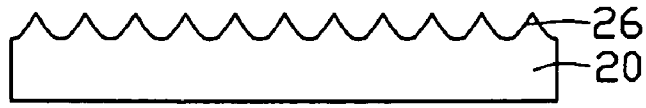

Referring to FIG. 6, the non-dissolvent regions 221 are removed. The substrate 20 having the plurality of U-shaped grooves 26 is thus obtained.

Figure 7:
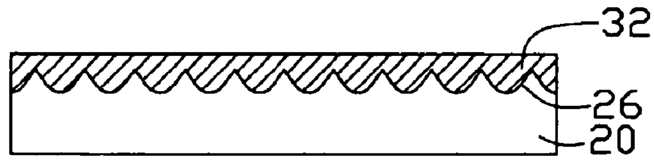

Referring to FIG. 7, a positive photoresist 32 is applied to a top undulating surface of the substrate 20. The U-shaped grooves 26 are filled in with the photoresist 32, such that a plane photoresist layer is formed on the substrate 20.

Figure 8:
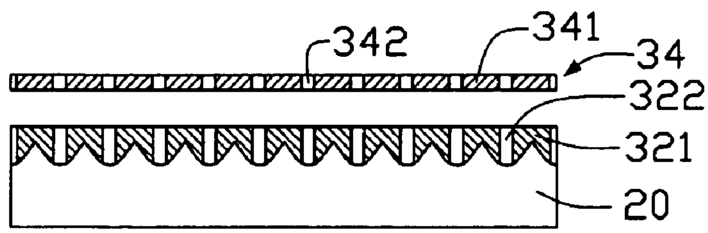

Referring to FIG. 8, another patterned mask 34 is aligned with the substrate 20. The mask 34 has a strip pattern comprising transmissive regions 342 and opacity regions 234, which are respectively smaller and larger than the corresponding transmissive regions 242 and opacity regions 241 of the mask 24 (shown in FIG. 3). Centers of the transmissive regions 342 are aligned with corresponding bottoms of the U-shaped grooves 26. The photoresist 32 is then exposed to high intensity yellow light through the mask 34. Alternatively, the photoresist 32 may be exposed to UV (ultraviolet) light or another suitable light. The photoresist 32 forms dissolvent regions 322 and retains non-dissolvent regions 321, corresponding to the transmissive regions 342 and the opacity regions 341 respectively. The dissolvent regions 322 cover the bottoms of the U-shaped grooves 26.

Figure 9:
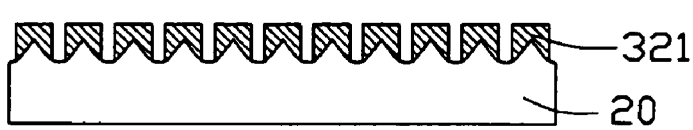

Referring to FIG. 9, the substrate 20 is dipped into a developer for a predetermined period of time so as to precisely dissolve and remove the dissolvent regions 322 of the photoresist 32. The non-dissolvent regions 321 remain intact. In this way, the pattern of the mask 34 is transferred to the substrate 20.

Figure 10:

Referring to FIG. 10, the substrate 20 is dipped in an acid bath (not shown), thereby etching exposed portions of the undulating surface of the substrate 20 with high efficiency. A plurality of V-shaped grooves 27 is thus formed on the substrate 20.

Figure 11:
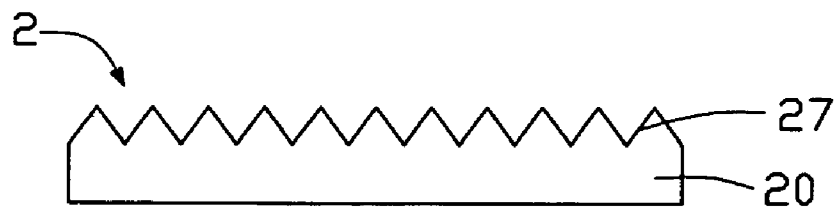
Figure 12:
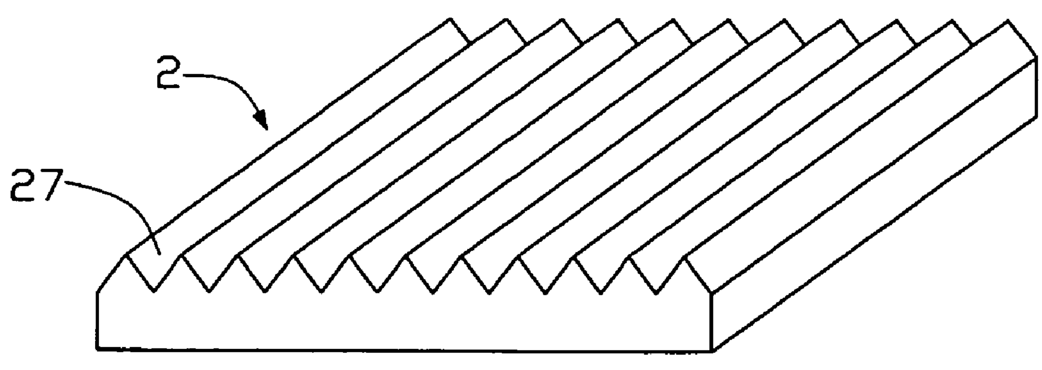
FIG. 12 is an isometric view of the light guide plate mold having V-shaped grooves produced in accordance with the present invention.

Referring to FIGS. 11–12, the non-dissolvent regions 321 are removed. The light guide plate mold 2 having the plurality of V-shaped grooves 27 is thus obtained. The V-shaped grooves 27 are parallel to each other. Each V-shaped groove 27 defines a cross-sectional angle in the range from 75° to 115°, and has a depth in the range from 5 $\mu$m to 100 $\mu$m.

For precisely controlling the shapes of the V-shaped grooves 27, appropriate steps in the above-mentioned processes can be repeated. In each repeat, a patterned mask having a strip pattern is used. The patterned mask has smaller transmissive regions compared with those of the previously used patterned mask.

In the photolithographic processes according to the present invention, negative photoresist can be used instead of positive photoresist. Appropriate steps in the above-mentioned processes are altered accordingly.

Compared with conventional processes for producing a light guide plate mold, the method of the present invention can produce a light guide plate mold having V-shaped grooves at a lower cost. In addition, formation of the shapes of the V-shaped grooves can be precisely controlled.

It is to be understood, however, that even though numerous characteristics and advantages of the present invention have been set forth in the foregoing description, together with details of the steps of the invention, the disclosure is illustrative only, and changes may be made in detail to the full extent indicated by the broad general meaning of the terms in which the appended claims are expressed.

What is claimed is:

1. A method for producing a light guide plate mold, comprising the steps of:

applying a first photoresist onto a surface of a mold substrate;

forming a first pattern on the first photoresist by photolithography with a first patterned mask;

etching the surface, and removing the first photoresist, thereby providing the substrate having substantially U-shaped grooves thereon;

applying a second photoresist onto the substrate;

forming a second pattern on the second photoresist by photolithography with a second patterned mask, the second patterned mask having smaller transmissive regions compared to those of the first patterned mask; and etching a surface of the substrate, and removing the second photoresist, thereby providing the substrate having substantially V-shaped grooves thereon.

2. The method as claimed in claim 1, the step of forming the second pattern comprises exposing the second photoresist to light using the second patterned mask so as to form dissolvent regions covering bottoms of the U-shaped grooves.

3. The method as claimed in claim 2, wherein the second photoresist is exposed to yellow light.

4. The method as claimed in claim 1, wherein the first patterned mask has a strip pattern, in which transmissive regions and opacity regions are alternately disposed.

5. The method as claimed in claim 4, wherein the second patterned mask has a strip pattern, in which the smaller transmissive regions correspond to those of the first patterned mask.

6. The method as claimed in claim 5, wherein centers of the smaller transmissive regions of the second patterned mask are aligned with the bottoms of the U-shaped grooves.

7. The method as claimed in claim 1, wherein the mold substrate is made of resin.

8. The method as claimed in claim 1, wherein the mold substrate is made of metal.

9. The method as claimed in claim 1, wherein the first and second photoresists are positive photoresists.

10. The method as claimed in claim 1, wherein each of the V-shaped grooves has a cross-sectional angle in the range from 75° to 115°.

11. The method as claimed in claim 1, wherein each of the V-shaped grooves has a depth in the range from 5 $\mu$m to 100 $\mu$m.

12. The method as claimed in claim 1, wherein the V-shaped grooves are formed parallel to each other.

13. A method for producing a light guide plate mold, comprising the steps of:

forming a strip pattern on a first photoresist applied on a mold substrate by a first photolithography process;

etching the substrate;

removing the first photoresist so as to provide the substrate having substantially U-shaped grooves thereon;

forming a second strip pattern on a second photoresist applied on the substrate by a second photolithography process;

etching the substrate; and removing the second photoresist so as to provide the substrate having V-shaped grooves thereon.

14. The method as claimed in claim 13, wherein a first patterned mask is adopted in the first photolithography process, the first patterned mask having a strip pattern.

15. The method as claimed in claim 14, wherein the strip pattern has transmissive regions and opacity regions alternately disposed therein.

16. The method as claimed in claim 15, wherein a second patterned mask is adopted in the second photolithography process, the second patterned mask having smaller transmissive regions compared to those of the first patterned mask.

17. The method as claimed in claim 16, wherein centers of the smaller transmissive regions of second patterned mask are aligned with bottoms of the U-shaped grooves.

18. A method for producing a light guide plate mold, comprising the steps of:

applying a first photoresist onto a surface of a mold substrate under a condition that said first photoresist is characterized by a first pattern to define a plurality of farther spaced first non-dissolvent regions thereof;

providing the substrate having dull grooves therein via a first etching process;

applying a second photoresist onto the substrate under a condition that said second photoresist is characterized by a second pattern to define a plurality of closer spaced second non-dissolvent regions in alignment with the corresponding first non-dissolvent regions, respectively;

sharpening a bottom portion of each said dull grooves via a second etching process.

19. The method as claimed in claim 18, wherein said first photoresist and said second photoresist are removed from the substrate, respectively, once the corresponding first etching process and second etching process are finished.

* * * * *